(12) United States Patent
Yu et al.

(10) Patent No.: US 9,432,176 B2
(45) Date of Patent: Aug. 30, 2016

(54) CIRCUIT AND METHOD FOR CLOCK AND DATA RECOVERY

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Po-Shing Yu, Miaoli County (TW); Ting-Hao Wang, Keelung (TW); Shih-Han Yeh, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/686,763

(22) Filed: Apr. 14, 2015

(65) Prior Publication Data
US 2015/0304097 A1 Oct. 22, 2015

(30) Foreign Application Priority Data
Apr. 17, 2014 (TW) .............................. 103114056 A (51) Int. Cl.
| | |
|---|---|
| *H04L 7/02* | (2006.01) |
| *H04L 7/00* | (2006.01) |
| *H04L 7/033* | (2006.01) |
| *H03L 7/07* | (2006.01) |
| *H03L 7/08* | (2006.01) |
| *H03L 7/081* | (2006.01) |
| *H03L 7/091* | (2006.01) |

(52) U.S. Cl.
CPC .............. *H04L 7/0025* (2013.01); *H03L 7/07* (2013.01); *H03L 7/0807* (2013.01); *H03L 7/0814* (2013.01); *H03L 7/091* (2013.01); *H04L 7/033* (2013.01)

(58) Field of Classification Search
CPC ... H04L 7/0337; H04L 7/0334; H04L 7/033; H04L 7/0029; H04L 7/0331; H04L 7/0338; H04L 7/0066; H03L 7/091
USPC .................................................. 375/354–376
See application file for complete search history.

(56) References Cited

U.S. PATENT DOCUMENTS

| | | | | |
|---|---|---|---|---|
| 5,950,115 A | * | 9/1999 | Momtaz .................... | H03L 7/07 327/147 |
| 6,509,773 B2 | * | 1/2003 | Buchwald ............. | H03L 7/0814 327/248 |
| 7,295,644 B1 | * | 11/2007 | Wu ....................... | H03L 7/0807 375/375 |

(Continued)

*Primary Examiner* — James M Perez
(74) *Attorney, Agent, or Firm* — CKC & Partners Co., Ltd.

(57) ABSTRACT

A clock and data recovery circuit includes a sampling module, a phase detect module, a parallel-to-serial converter and a phase adjust module. The sampling module generates a data signal and an edge signal according to input data, a first clock signal and a second clock signal. The phase detect module detects a phase of the data signal and a phase of the edge signal to generate first output recovered data and a first phase adjust signal. The parallel-to-serial converter performs a parallel-to-serial conversion on the first recovered data and the first phase adjust signal, so as to generate second output recovered data and a second phase adjust signal. The phase adjust module generates the first clock signal and the second clock signal, and adjusts the first clock signal and the second clock signal according to the second output recovered data and the second phase adjust signal.

14 Claims, 7 Drawing Sheets

(56) References Cited

U.S. PATENT DOCUMENTS

| | | | | |
|---|---|---|---|---|
| 7,366,267 B1* | 4/2008 | Lee | H03K 5/135 | 341/100 |
| 7,466,787 B1* | 12/2008 | Ross | H03D 13/003 | 327/147 |
| 7,715,514 B2* | 5/2010 | Takeuchi | H03L 7/0814 | 327/160 |
| 8,050,373 B2* | 11/2011 | Buchwald | H04L 7/0091 | 327/147 |
| 8,509,371 B2* | 8/2013 | Kenney | H03L 7/235 | 375/316 |
| 8,903,031 B2* | 12/2014 | Werner | H03D 13/004 | 375/327 |
| 9,036,764 B1* | 5/2015 | Hossain | H03L 7/087 | 375/355 |
| 9,106,230 B1* | 8/2015 | Wang | H03K 19/1737 | |
| 9,184,909 B1* | 11/2015 | McCracken | H04L 7/042 | |
| 9,369,313 B1* | 6/2016 | Yu | H04L 25/03057 | |
| 2002/0039394 A1* | 4/2002 | Buchwald | H03L 7/0814 | 375/355 |
| 2002/0105386 A1* | 8/2002 | Shastri | H03L 7/07 | 331/11 |
| 2004/0170244 A1* | 9/2004 | Cranford, Jr. | H03L 7/07 | 375/373 |
| 2005/0180536 A1* | 8/2005 | Payne | H03L 7/0814 | 375/354 |
| 2005/0207520 A1* | 9/2005 | Su | H04L 7/005 | 375/355 |
| 2005/0238126 A1* | 10/2005 | Ribo | H03L 7/0814 | 375/355 |
| 2006/0002497 A1* | 1/2006 | Zhang | H03L 7/0814 | 375/355 |
| 2006/0224339 A1* | 10/2006 | Kim | H03L 7/0814 | 702/66 |
| 2010/0301953 A1* | 12/2010 | Liang | H03L 7/0995 | 331/1 A |
| 2011/0090947 A1* | 4/2011 | Peng | H04L 25/03057 | 375/233 |
| 2012/0109356 A1* | 5/2012 | Kong | H04L 7/033 | 700/121 |
| 2013/0272358 A1* | 10/2013 | Chen | H04L 1/205 | 375/224 |
| 2013/0329843 A1* | 12/2013 | Takeuchi | H04L 7/0331 | 375/375 |
| 2014/0152364 A1* | 6/2014 | Pan | H03H 11/20 | 327/238 |
| 2014/0177699 A1* | 6/2014 | Tan | H04L 7/033 | 375/233 |
| 2014/0334584 A1* | 11/2014 | Lakkis | H03L 7/07 | 375/376 |
| 2014/0362962 A1* | 12/2014 | Meier | H04L 7/033 | 375/375 |
| 2015/0188697 A1* | 7/2015 | Lin | H03L 7/085 | 375/375 |
| 2016/0043862 A1* | 2/2016 | Wu | H04L 7/042 | 375/375 |

* cited by examiner

CIRCUIT AND METHOD FOR CLOCK AND DATA RECOVERY

This application claims priority to Taiwan Application Serial Number, 103114056, filed Apr. 17, 2014, which is herein incorporated by reference.

BACKGROUND

1. Technical Field

The present disclosure relates to an integrated circuit. More particularly, the present disclosure relates to a clock and data recovery (CDR) circuit.

2. Description of Related Art

With the rapid development of manufacturing technology, the operating speed of integrated circuits has been significantly improved. In a high speed communication system, a clock and data recovery (CDR) circuit is commonly utilized for assuring that input data can be correctly read after being transferred.

As the speed of processing data increases, the noises and frequency offsets caused by a data transmitter terminal increase. To tolerate more frequency offsets, the CDR circuit requires to be operated at a higher frequency. As a result, the implementation of the CDR circuit is difficult to be achieved due to hardware limitation.

To resolve the aforementioned problem, the operating frequency of the CDR circuit can be increased by enlarging a phase step adjusted by the CDR circuit in a unit of time. However, through this arrangement, the CDR circuit cannot instantly adjust the high-speed data signal. Therefore, a heretofore-unaddressed need exists to address the aforementioned deficiencies and inadequacies.

SUMMARY

An aspect of the present disclosure is to provide a clock and data recovery circuit. The clock and data recovery circuit includes a sampling module, a phase detect module, a parallel-to-serial converter and a phase adjust module. The sampling module is configured to generate a data signal and an edge signal according to input data, a first clock signal and a second clock signal. The phase detect module is configured to detect a phase of the data signal and a phase of the edge signal to generate first output recovered data and a first phase adjust signal. The parallel-to-serial converter is configured to perform a parallel-to-serial conversion on the first recovered data and the first phase adjust signal, so as to generate second output recovered data and a second phase adjust signal. The phase adjust module is configured to generate the first clock signal and the second clock signal. The phase adjust module adjusts the first clock signal and the second clock signal according to the second output recovered data and the second phase adjust signal.

Another aspect of the present disclosure is to provide a clock and data recovery circuit. The clock and data recovery circuit includes a phase locked loop circuit, a first phase interpolator, a second phase interpolator, a sampling module, a serial-to-parallel converter, a phase detector a filter unit, and a parallel-to-serial converter. The first phase interpolator is electrically coupled to the phase locked loop circuit, and is configured to generate a first clock signal. The second phase interpolator is electrically coupled to the phase locked loop circuit, and is configured to generate a second clock signal, in which the first clock signal and the second clock signal are different in phase by 90 degrees. The sampling module is configured to receive input data, the first clock signal, and the second signal. The serial-to-parallel converter is electrically coupled to the sampling module. The phase detector is electrically coupled to the serial-to-parallel converter, in which the serial-to-parallel converter operates at a first operating frequency. The filter unit is electrically coupled to the phase detector. The parallel-to-serial converter is electrically coupled to the first phase interpolator and the second phase interpolator, in which the first phase interpolator and the second phase interpolator operate at a second operating frequency, and the second operating frequency is higher than the first operating frequency.

Another aspect of the present disclosure is to provide a clock and data recovery method. The clock and data recovery method includes the following steps of respectively sampling input data according to a first clock signal and a second clock signal to generate a data signal and an edge signal; detecting a phase of the data signal and a phase of the edge signal to generate first output recovered data and a first phase adjust signal; performing a parallel-to-serial conversion on the first output received data and the first phase adjust signal to generate second output recovered data and a second phase adjust signal; and adjusting the first clock signal and the second clock signal according to the second output recovered data and the second phase adjust signal.

In sum, the circuit and method for clock and data recovery utilize the parallel-to-serial converter or conversion to reduce the limitations of the hardware implementation, and meanwhile to maintain the phase updating rate, thereby instantly correcting a phase error.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

Although the terms "first," "second," etc., may be used herein to describe various elements, these elements should not be limited by these terms. These terms are used to distinguish one element from another.

In this document, the term "coupled" may also be termed as "electrically coupled," and the term "connected" may be termed as "electrically connected." "Coupled" and "connected" may also be used to indicate that two or more elements cooperate or interact with each other.

Figure 1:
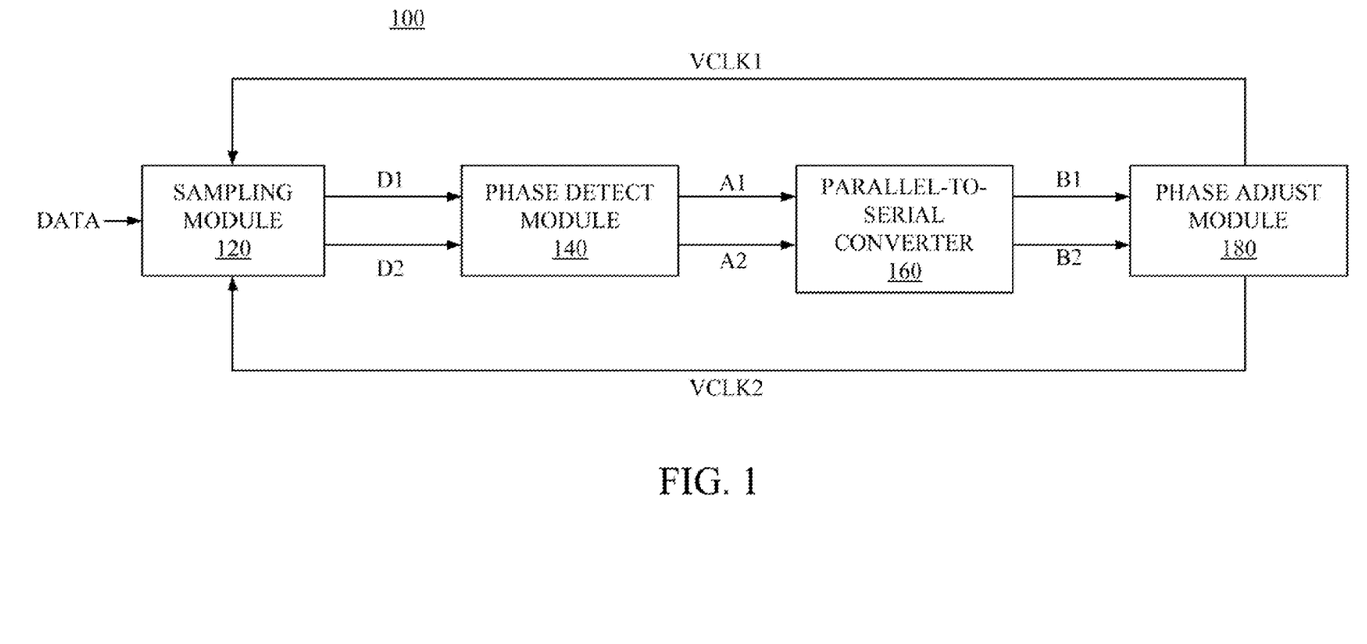
FIG. 1 is a schematic diagram of a clock and data recovery circuit according to one embodiment of the present disclosure.

FIG. 1 is a schematic diagram of a clock and data recovery circuit 100 according to one embodiment of the present disclosure. As shown in FIG. 1, the clock and data recovery circuit 100 includes a sampling module 120, a phase detect module 140, a parallel-to-serial converter 160, and a phase adjust module 180.

The sampling module 120 is configured to generate a data signal D1 and an edge signal D2 according to input data DATA, a first clock signal VCLK1, and a second clock signal VCLK2. In this embodiment, each of the data signal D1 and the edge signal D2 can be a multi-bit signal.

The phase detect module 140 is electrically coupled to the sampling module 120 to receive the data signal D1 and the edge signal D2. The phase detect module 140 is configured to detect a phase of the data signal D1 and a phase of the edge signal D2 to generate first output recovered data A1 and a first phase adjust signal A2.

The parallel-to-serial converter 160 is configured to perform a parallel-to-serial conversion on the first output recovered data A1 and the first phase adjust signal A2, so as to generate second output recovered data B1 and a second phase adjust signal B2.

For example, the first output recovered data A1 and the first phase adjust signal A2 are 2-bit digital data having a first frequency, for example, 750 million Hertz (MHZ). After the parallel-to-serial conversion is performed, the parallel-to-serial converter 160 generates the second output recovered data B2 and the second phase adjust signal B2 in which the second output recovered data B2 and the second phase adjust signal B2 are 1-bit digital data having a second frequency, for example, 1500 MHZ. In other words, the parallel-to-serial converter 160 is configured to increase the frequency of the first output recovered data A1 and that of the first phase adjust signal A2, and to serially output the second output recovered data B1 and the second phase adjust signal B2.

The phase adjust module 180 is configured to generate the first clock signal VCLK1 and the second clock signal VCLK2. The phase adjust module 180 further adjusts the first clock signal VCLK1 and the second clock signal VCLK2 according to the second output recovered data B1 and the second phase adjust signal B2.

The following paragraphs provide certain embodiments related to the clock and data recovery circuit 100 to illustrate functions and applications thereof. However, the present disclosure is not limited to the following embodiments.

Figure 2A:
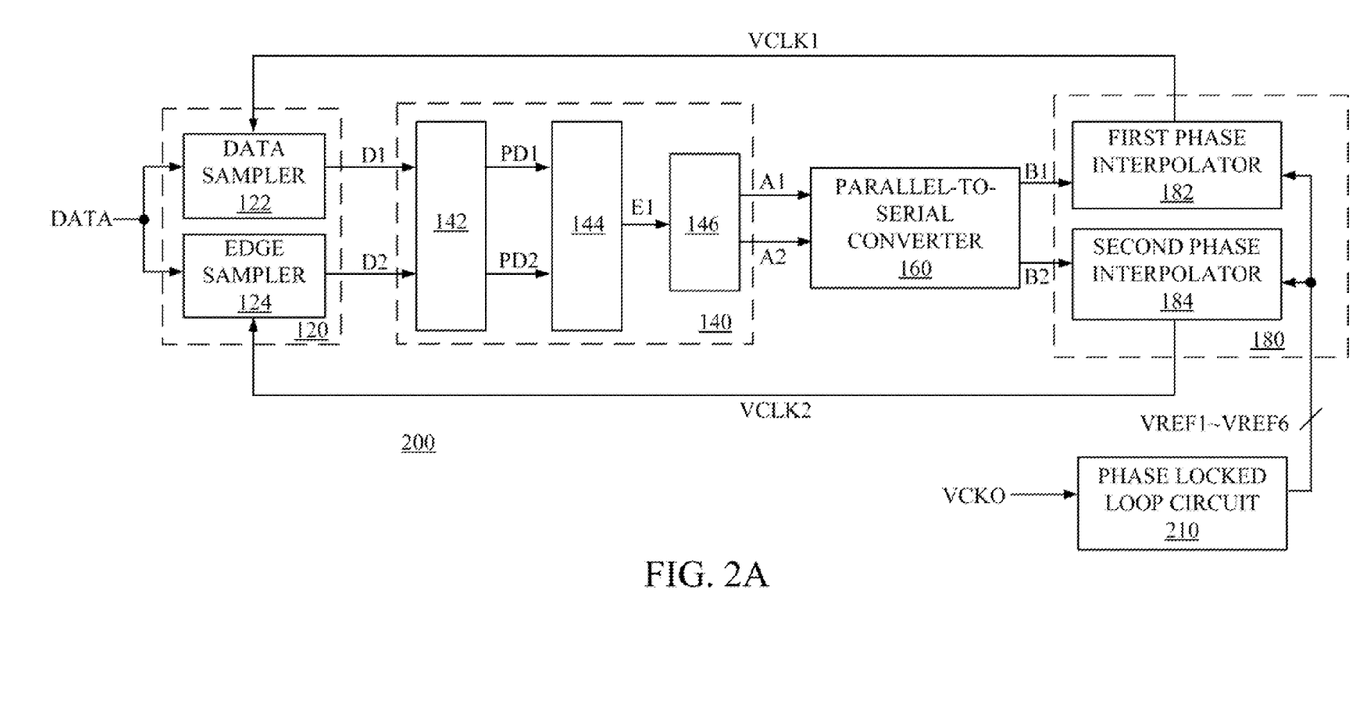
FIG. 2A is a schematic diagram of a clock and data recovery circuit, according to one embodiment of the present disclosure.

Reference now made to FIG. 2A. FIG. 2A is a schematic diagram of a clock and data recovery circuit 200 according to one embodiment of the present disclosure. Compared with FIG. 1, the clock and data recovery circuit 200 further includes a phase locked loop circuit 210. The phase locked loop circuit 210 is configured to generate and output reference clock signals VREF1-VREF6 to the phase adjust module 180 according an external clock signal VCKO. In actual applications, the reference clock signals VREF1-VREF6 can be different with each other in phase by 60 degrees.

Figure 2B:
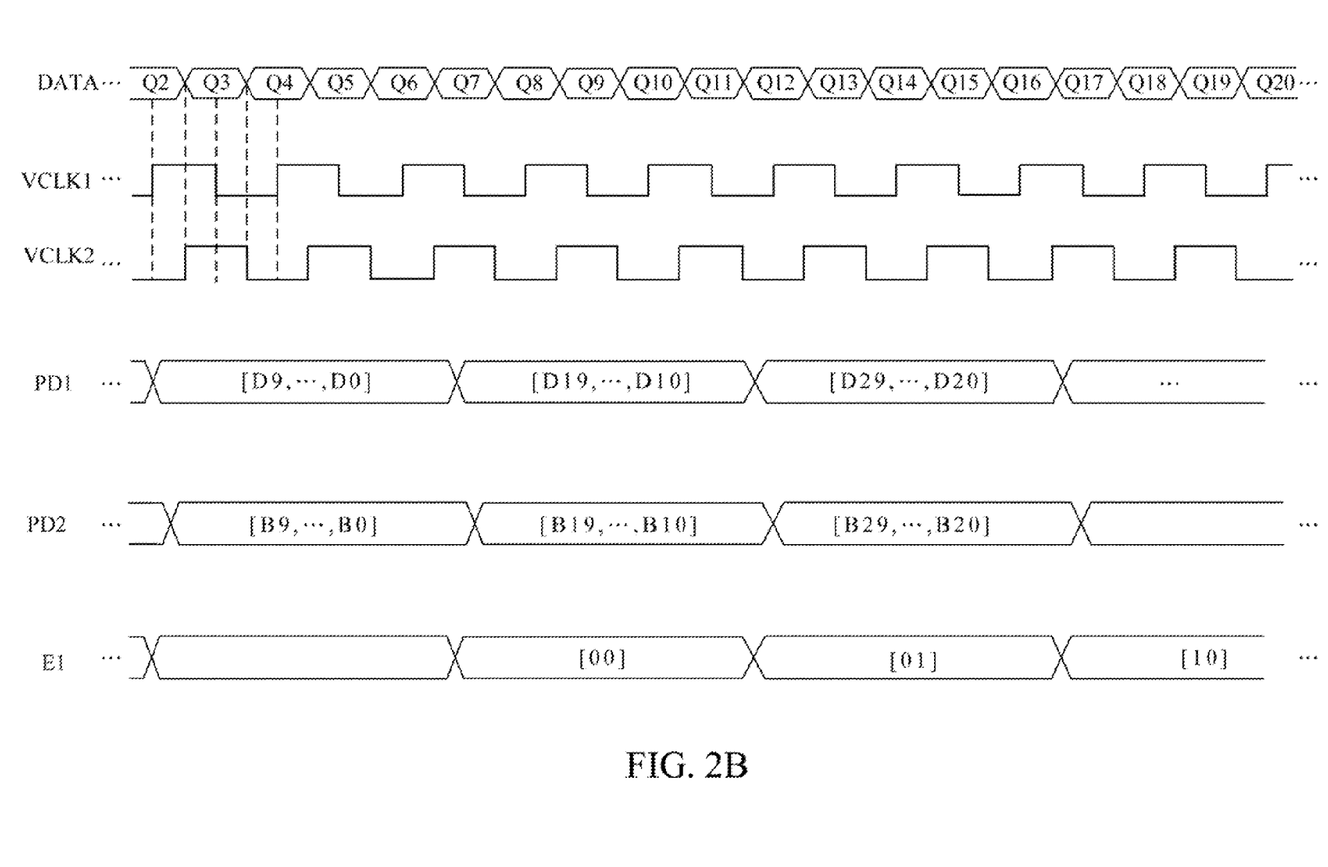
FIG. 2B is a graph illustrating operation waveforms of the clock and data recovery circuit in FIG. 2A according to one embodiment of the present disclosure.

FIG. 2B is a graph illustrating operation waveforms of the clock and data recovery circuit in FIG. 2A according to one embodiment of the present disclosure. For clearly illustration, in the following paragraphs, the operations of the clock and data recovery circuit 200 in FIG. 2A are described with reference to the waveforms shown in FIG. 2B.

In this embodiment, the phase adjust module 180 includes a first phase interpolator 182 and a second phase interpolator 184. The first phase interpolator 182 and the second phase interpolator 184 are electrically coupled to the phase locked loop circuit 210 to receive the reference clock signals VREF1-VREF6. The first phase interpolator 182 is configured to generate the first clock signal VCLK1 according to the reference clock signals VREF1-VREF6 and the second output recovered data B1 The second phase interpolator 184 is configured to generate the second clock signal VCLK2 according to the reference clock signals VREF1-VREF6 and the second phase adjust signal B2.

Further, as shown in FIG. 2A, the sampling module 120 includes a data sampler 122 and an edge sampler 124. The data sampler 122 is configured to sample the input data DATA according to the first clock signal VCLK1, so as to generate the data signal D1. The edge sampler 124 is configured to sample a rising edge or a falling edge of the input data DATA according to the second clock signal VCLK2, so as to generate the edge signal D2.

In greater detail, in this embodiment, as shown in FIG. 2B, the input data. DATA is presented as successively transmitted bits Q0-Q20, and the first clock signal VCLK1 and the second clock signal VCLK2 are different in phase by 90 degrees. Thus, the data sampler 122 can record timings of intermediate values of respective bits Q0-Q20 of the input data DATA according to the first clock signal VCLK1, so as to generate the data signal D1 having bits D0-D20 (not shown in FIG. 2B). Similarly, the edge sampler 124 can record timings of the rising edge or the falling edge of the input data DATA according to the second clock signal VCLK2, so as to generate the edge signal D2 having bits B0-B20 (not shown in FIG. 2B).

In this embodiment, as shown in FIG. 2A, the phase detect module 140 includes a serial-to-parallel converter 142, a phase detector 144, and a filter unit 146. The serial-to-parallel converter 142 is electrically coupled to the data sampler 122 and the edge sampler 124 to receive the data signal D1 and the edge signal D2. The serial-to-parallel converter 142 is configured to perform a serial-to-parallel conversion on the data signal D1 and the edge signal D2, so as to generate a parallel data signal PD1 and a parallel phase signal PD2.

For example, the data signal D1 and the edge signal D2 are 1-bit data having a first frequency, for example, about 6 Giga hertz (GHz). The serial-to-parallel converter 142 can perform the serial-to-parallel conversion on the data signal D1 and the edge signal D2 to output the parallel data signal PD1 and the parallel phase signal PD2, in which the parallel data signal PD1 and the parallel phase signal PD2 have a second frequency, for example, about 600 MHz. For illustration, as shown in FIG. 2B, the parallel data signal PD1 is formed with 10 bits [D9, . . . , D0] and [D19, . . . , D10] of the data signal D1. The parallel phase data signal PD2 is formed with 10 bits [B9, . . . , B0] and [B19, . . . , B10] of the edge signal D2.

In other words, in this embodiment, through the operations of the serial-to-parallel converter 142, the frequencies of respective signals transmitted in the phase detect module 140 are decreased. As a result, limitations of hardware implementation can be reduced.

The phase detector 144 is configured to detect a phase of the parallel data signal PD1 and a phase of the parallel phase signal PD2, so as to generate an error signal E1. In this embodiment, as shown in FIG. 2B, the error signal E1 has two bits. For example, when the phase of the parallel data signal PD1 leads the phase of the parallel phase signal PD2, the value of the error signal E1 is "00" When the phase of the parallel data signal PD1 is the same as the phase of the parallel phase signal PD2, the value of the error signal E1 is "01." Alternatively, when the phase of the parallel data signal PD1 lags behind the phase of the parallel phase signal PD2, the value of the error signal E1 is "10."

The filter unit 146 is electrically coupled to the phase detector 144 to receive the error signal E1. The filter unit 146 is configured to generate a first output recovered data A1 and a first phase adjust signal A2. In this embodiment the filter unit 140 is a digital filter.

Figure 2C:
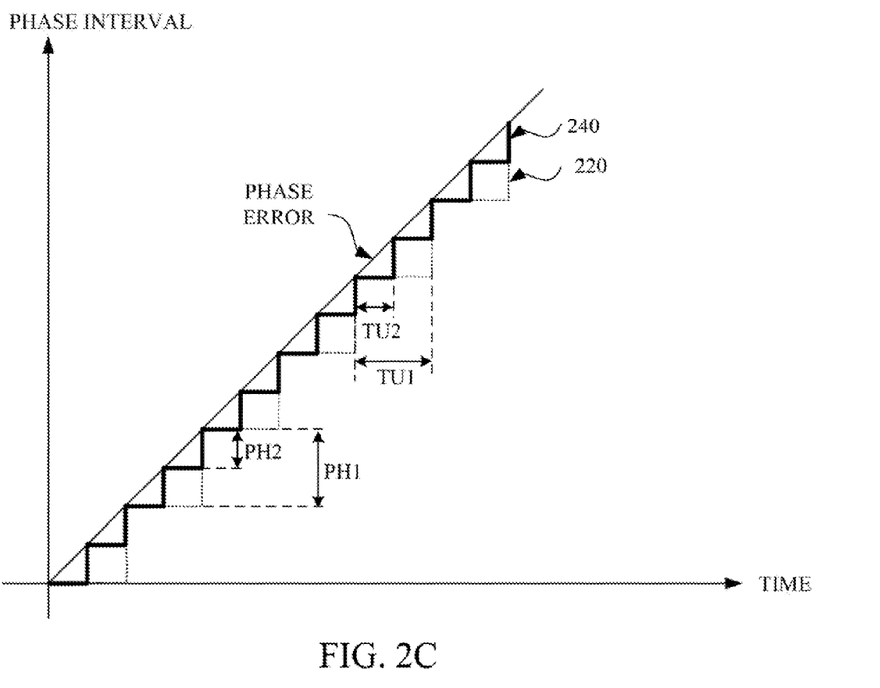
FIG. 2C is a graph illustrating a relationship between a phase interval and time according to one embodiment of the present disclosure.

Reference is now made to FIG. 2C. FIG. 2C is a graph illustrating a relationship between a phase interval and time according to one embodiment of the present disclosure. A phase error in FIG. 2C is defined as a phase error caused by the frequency offset of the input data DATA. For example, if the input data DATA are transmitted through a Serial Advanced Technology Attachment (SATA) interface or a Serial Attached SCSI (SAS) interface, the amount of the phase errors caused by the offset of internal clock signals in the SATA interface or in the SAS interface may be about 5200 parts per million (PPM).

As described above, a curve 200 corresponding to some approaches utilizes a larger unit of phase step PH1 to adjust the first clock signal VCLK1 and the second clock signal VCLK2. However, through this configuration, a longer unit of time period TU1 is required to correct a certain amount of the phase errors. Relatively, to correct the same amount of the phase errors, a curve 240 corresponding to the present disclosure utilizes a short unit time period TU2 and a smaller unit of phase step PH2 to adjust the first clock signal VCLK1 and the second clock signal VCLK2. As a result, the phase errors can be instantly corrected.

In other words, by utilizing the parallel-to-serial converter 160, the operation frequency (which corresponds to the unit time period TU2) of the first phase interpolator 182 and the operation frequency of the second phase interpolator 184 of the clock and data recovery circuit 200 can be accelerated. As a result, the phase errors can be instantly corrected. On the other hand, the operation frequency of the first phase interpolator 182 and the operation frequency of the second phase interpolator 184 can be at lease twice faster than the operation frequency of the phase detector 144. Therefore, the phase detector 144 and the filter unit 146 can operate at a slower operation frequency. Accordingly, in this embodiment, the clock and data recovery circuit 200 can not only correct the phase errors instantly but also can reduce the limitations of hardware implementation for the phase detector 144 and the filter unit 146.

Figure 3A:
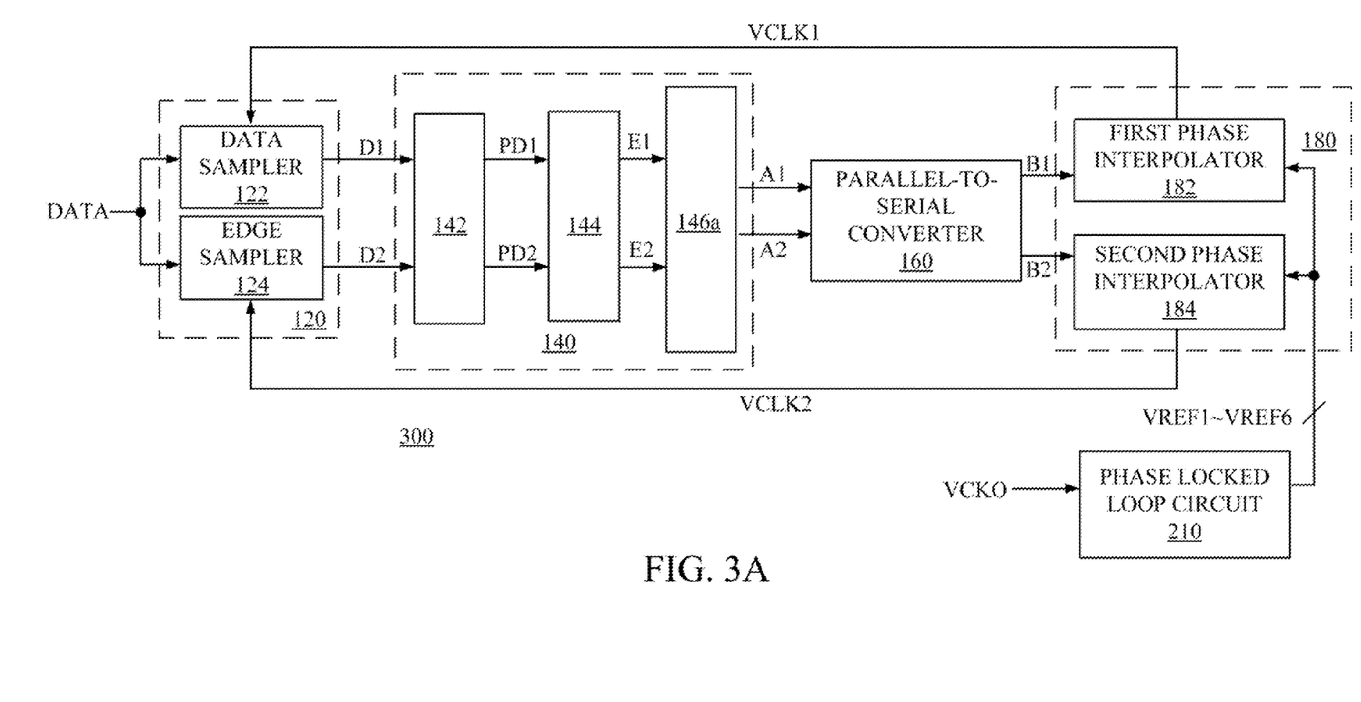
FIG. 3A is a schematic diagram of a clock and data recovery circuit according to one embodiment of the present disclosure.
Figure 3B:
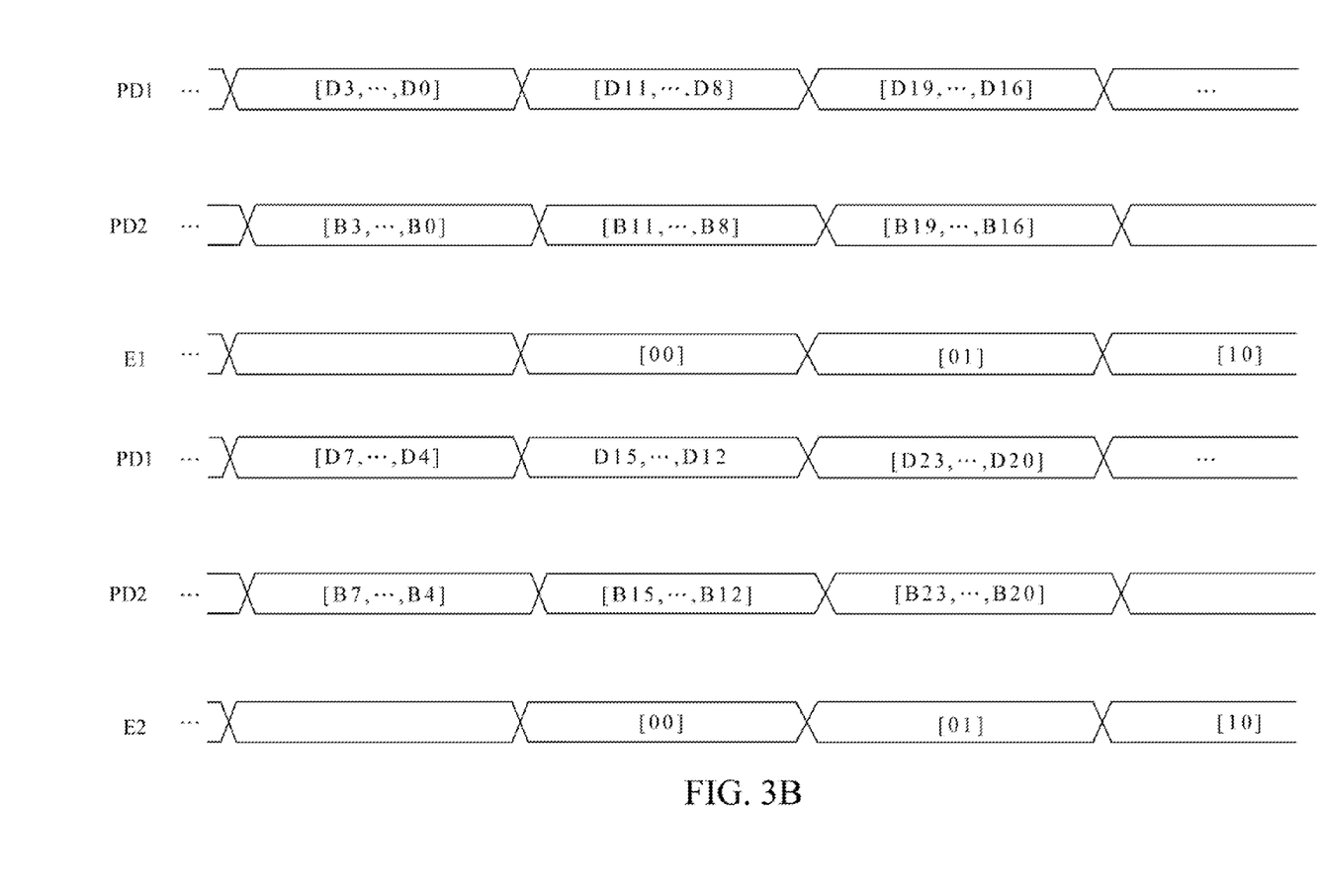
FIG. 3B illustrates operation waveforms of the clock and data recovery circuit in FIG. 3A according to one embodiment of the present disclosure.

Reference is now made to both of FIG. 3A and FIG. 3B. FIG. 3A is a schematic diagram of a clock and data recovery circuit according to one embodiment of the present disclosure. FIG. 3B illustrates operation waveforms of the clock and data recovery circuit in FIG. 3A according to one embodiment of the present disclosure.

Compared with FIG. 2A, in FIG. 3A, the filter unit 146 of the clock and data recovery circuit 300 is a parallel-processing digital filter 146a. Compared with the previous embodiments, in this embodiment, the parallel-processing digital filter 146a is utilized to parallel process the input data DATA, and the phase detector 144 can accordingly generate the error signal E1 and an error signal E2 at the same time. The parallel-processing digital filter 146a is configured to parallel process the first output recovered data A1 and the first phase adjust signal A2.

For example, the input data DATA is a 20 bits signal. As shown in FIG. 3B, by parallel processing the input data DATA, the phase detector 144 can compare the parallel data signal PD1 formed from four bits [D3, . . . , D0] with the parallel phase signal PD2 formed from four bits [B3, . . . , D0], so as to generate the error signal E1. At the same time, the phase detector 144 can compare the parallel data signal PD1 formed from the next four bits [D7, . . . , D4] with the parallel phase signal PD2 formed by the next four bit [B7, . . . , B4], so as to generate the error signal E2. With the similar operations, the input data DATA of 20 bits can be parallel processed. Compared with the previous embodiments, this embodiment can process the input data DATA of more bits by parallel processing.

Figure 4:
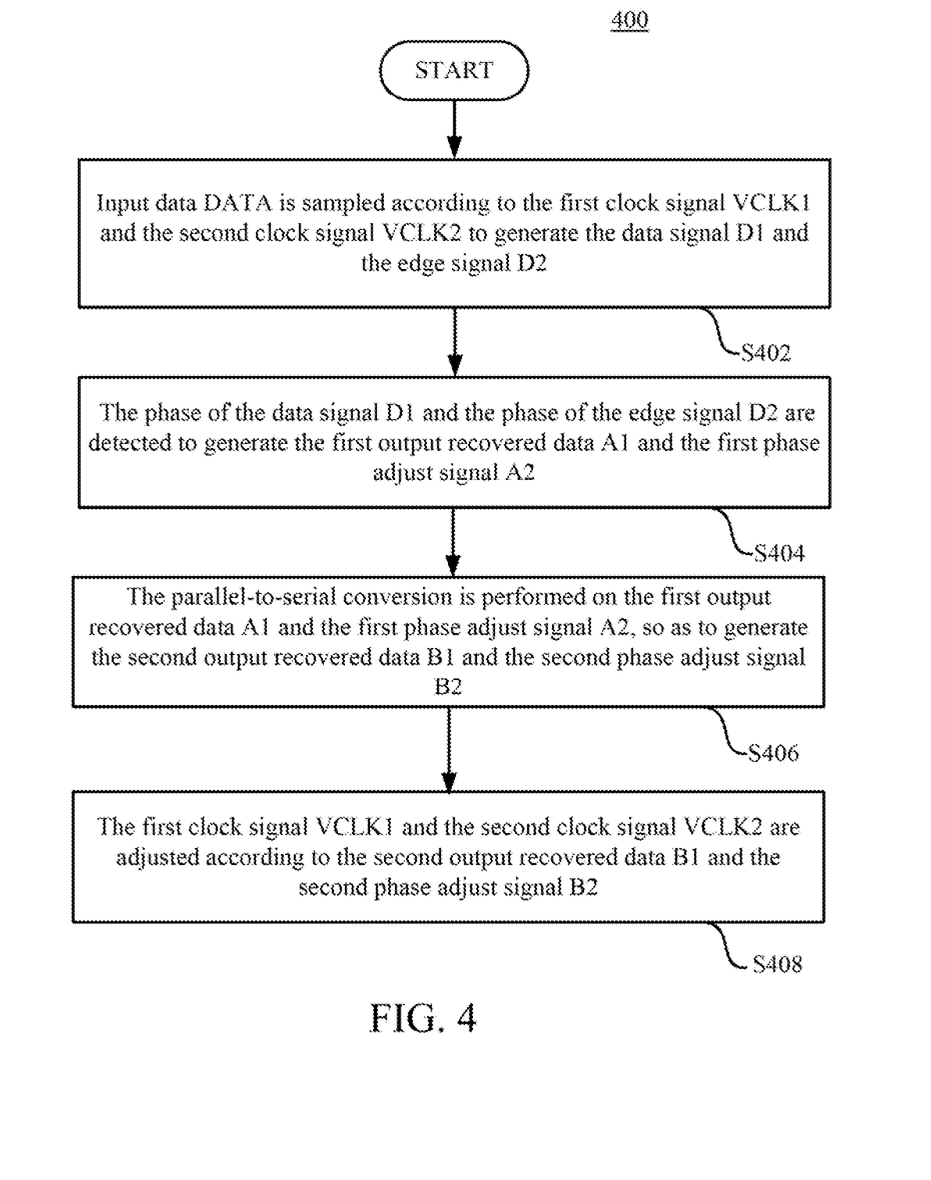
FIG. 4 is a flow chart of a clock and data recovery method according to one embodiment of the present disclosure.

Reference is now made to FIG. 4. FIG. 4 is a flow chart of a clock and data recovery method according to one embodiment of the present disclosure. As shown in FIG. 4, the clock and data recovery method 400 includes step S402, step S404, step S406, and step S408.

In step S402, the input data DATA is sampled according to the first clock signal VCLK1 and the second clock signal VCLK2 to generate the data signal D1 and the edge signal D2.

For example, as shown in FIG. 2A and FIG. 2B, by utilizing the phase locked loop circuit 210, the first phase interpolator 182 and the second phase interpolator 184 can generate the first clock signal VCLK1 and the second clock signal VCLK2, in which the first clock signal VCLK1 and the second clock signal VCLK2 are different in phase by about 90 degrees. The data sampler 122 can accordingly sample the timings of the intermediate values of the input data DATA to generate the data signal D1. The edge sampler 124 samples the rising edge or the falling edge of the input data DATA according to the second clock signal VCLK2, so as to generate the edge signal D2.

In step S404, the phase of the data signal D1 and the phase of the edge signal D2 are detected to generate the first output recovered data A1 and the first phase adjust signal A2.

For example, as described above, the serial-to-parallel converter 142 can perform the serial-to-parallel conversion on the data signal D1 and the edge signal D2, so as to generate the parallel data signal PD1 and the parallel phase signal PD2. The phase detector 144 detects the phase of the parallel data signal PD1 and the parallel phase signal PD2 to generate the error signal E1. The filter unit 146 filters the error signal E1 to generate the first output recovered data A1 and the first phase adjust signal A2.

In step S406, the parallel-to-serial conversion is performed on the first output recovered data A1 and the first phase adjust signal A2, so as to generate the second output recovered data B1 and the second phase adjust signal B2.

In step S408, the first clock signal VCLK1 and the second clock signal VCLK2 are adjusted according to the second output recovered data B1 and the second phase adjust signal B2.

As shown in FIG. 2A, the parallel-to-serial converter 160 performs the parallel-to-serial conversion on the first output recovered data A1 and the first phase adjust signal A2, so as to generate the second output recovered data B1 and the second phase adjust signal B2 with high frequency. The first phase interpolator 182 and the second interpolator 184 can adjust the first clock signal VCLK1 and the second clock signal VCLK2 according to the second output recovered data B1 and the second phase adjust signal B2, respectively. As a result, the phase update rate for clock and data recovering is increased.

In sum, the circuit and method for clock and data recovery utilize the parallel-to-serial converter or conversion to reduce the limitations of the hardware implementation, and meanwhile maintain the phase updating rate, thereby achieving that the advantage of instantly correcting the phase errors.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A clock and data recovery circuit, comprising:
   a sampling module configured to generate a data signal and an edge signal according to input data, a first clock signal and a second clock signal;
   a phase detect module configured to, based on the data signal and the edge signal, perform a serial-to-parallel conversion and detect a phase difference between the data signal and the edge signal to generate at least one error signal, and to generate first output recovered data and a first phase adjust signal according to the at least one error signal;
   a parallel-to-serial converter configured to perform a parallel-to-serial conversion on the first recovered data and the first phase adjust signal, so as to generate second output recovered data and a second phase adjust signal; and
   a phase adjust module configured to generate the first clock signal and the second clock signal, wherein the phase adjust module adjusts the first clock signal and the second clock signal di to the second output recovered data and the second phase adjust signal.

2. The clock and data recovery circuit of claim 1, further comprising:
   a phase locked loop circuit configured to generate and output at least one reference clock signal to the phase adjust module according to an external clock signal, wherein the phase adjust module generates the first clock signal and the second clock signal according to the least one reference clock signal.

3. The clock and data recovery circuit of claim 2, wherein the phase adjust module comprises:
   a first phase interpolator configured to generate the first clock signal according to the at least one reference clock signal and the second output recovered data; and
   a second phase interpolator configured to generate the second clock signal according to the at least one reference clock signal and the second phase adjust signal.

4. The clock and data recovery circuit of claim 1, wherein the sampling module comprises:
   a data sampler configured to sample the input data to generate the data signal according to the first clock signal; and
   an edge sampler configured to detect a rising edge and a falling edge of the input data to generate the edge signal according to the second clock signal.

5. The clock and data recovery circuit of claim 1, wherein the phase detect module comprises:
   a serial-to-parallel converter configured to perform the serial-to-parallel conversion on the data signal and the edge signal, so as to generate a parallel data signal and a parallel phase signal; and
   a phase detector configured to detect a phase of the parallel data signal and a phase of the parallel phase signal to generate the at least one error signal; and
   a filter unit configured to generate the first output recovered data and the first phase adjust signal according to the at least one error signal.

6. The clock and data recovery circuit of claim 5, wherein the filter unit is a digital filter.

7. The clock and data recovery circuit of claim 5, wherein the filter unit is a parallel-processing digital filter configured to process the at least one error signal in parallel to generate the first output recovered data and the first phase adjust signal.

8. A clock and data recovery circuit, comprising:
   a phase locked loop circuit;
   a first phase interpolator which is electrically coupled to the phase locked loop circuit and is configured to generate a first clock signal;
   a second phase interpolator which is electrically coupled to the phase locked loop circuit and is configured to generate a second clock signal, wherein the first clock signal and the second clock signal are different in phase by 90 degrees;
   a sampling module configured to receive an input data, the first clock signal, and the second clock signal and accordingly generate a data signal and an edge signal;
   a serial-to-parallel converter electrically coupled to the sampling module, being configured to generate a parallel data signal and a parallel phase signal based on the data signal and the edge signal;
   a phase detector electrically coupled to the serial-to-parallel converter, and is configured to generate at least one error signal based on the parallel data and phase signals, wherein the serial-to-parallel converter operates at a first operating frequency;
   a filter unit electrically coupled to the phase detector to filter output signals of the phase detector; and
   a parallel-to-serial converter electrically coupled to the first phase interpolator and the second phase interpolator, and being configured to convert filtered signals, which are outputted from the filter unit, to serial signals that are outputted to the first interpolator and the second interpolator,
   wherein the first phase interpolator and the second phase interpolator operate at a second operating frequency, and the second operating frequency is higher than the first operating frequency.

9. The clock and data recovery circuit of claim 8, wherein the filter unit comprises a parallel-processing digital filter.

10. A clock and data recovery method, comprising:
    respectively sampling input data according to a first clock signal and a second clock signal to generate a data signal and an edge signal;
    based on the data signal and the edge signal, performing a serial-to-parallel conversion and then detecting a phase difference between a parallel data signal and a parallel phase signal, in order to generate at least one error signal;
    generating first output recovered data and a first phase adjust signal according to the at least one error signal;

performing a parallel-to-serial conversion on the first output recovered data and the first phase adjust signal in order to generate second output recovered data and a second phase adjust signal; and adjusting the first clock signal and the second clock signal according to the second output recovered data and the second phase adjust signal.

11. The clock and data recovery method of claim 10, further comprising:

transmitting an external clock signal to a phase locked loop circuit to generate at least one reference clock signal;

transmitting the at least one reference clock signal to a first phase interpolator to generate the first clock signal; and transmitting the at least one reference clock signal to a second phase interpolator to generate the second clock signal.

12. The clock and data recovery method of claim 10, wherein the step of generating the data signal and the edge signal comprises:

sampling the input data according to the first clock signal to generate the data signal; and detecting a rising edge and a falling edge of the input data according to the second clock signal to generate the edge signal;

wherein the first clock signal and the second clock signal are different in phase by 90 degrees.

13. The clock and data recovery method of claim 10, wherein the step of generating the at least one error signal comprises:

performing the serial-to-parallel conversion on the data signal and the edge signal to generate the parallel data signal and the parallel phase signal; and detecting a phase of the parallel data signal and a phase of the parallel phase signal to generate the at least one error signal;

transmitting the at least one error signal to a filter unit to generate the first output recovered data and the first phase adjust signal comprises:

transmitting the at least one error signal to a filter unit to generate the first output recovered data and the first phase adjust signal.

14. The clock and data recovery method of claim wherein the filter unit is a parallel-processing filter configured to parallel-process the at least one error signal to generate the first output recovered data and the first phase adjust signal.

* * * * *